(12) United States Patent
Kleint et al.

(10) Patent No.: US 7,005,355 B2
(45) Date of Patent: Feb. 28, 2006

(54) METHOD FOR FABRICATING SEMICONDUCTOR MEMORIES WITH CHARGE TRAPPING MEMORY CELLS

(75) Inventors: Christoph Kleint, Dresden (DE);
Christoph Ludwig, Langebrück (DE);
Joachim Deppe, Dresden (DE);
Jens-Uwe Sachse, Dresden (DE)

(73) Assignee: Infineon Technologies AG, Munich (DE)

( * ) Notice: Subject to any disclaimer, the term of this patent is extended or adjusted under 35 U.S.C. 154(b) by 233 days.

(21) Appl. No.: 10/735,411

(22) Filed: Dec. 12, 2003

(65) Prior Publication Data
US 2004/0147072 A1    Jul. 29, 2004

(30) Foreign Application Priority Data
Dec. 13, 2002 (DE) .................. 102 58 420

(51) Int. Cl.
*H01L 21/74* (2006.01)
*H01L 21/336* (2006.01)

(52) U.S. Cl. .................. 438/287; 438/401
(58) Field of Classification Search .............. 438/287, 438/401
See application file for complete search history.

(56) References Cited

U.S. PATENT DOCUMENTS

| 5,002,902 A | 3/1991 | Watanabe |
| 5,738,961 A | 4/1998 | Chen |
| 5,960,296 A * | 9/1999 | Auzino et al. ............... 438/401 |
| 6,127,737 A | 10/2000 | Kuroi et al. |
| 6,146,969 A | 11/2000 | Tan et al. |
| 6,153,492 A | 11/2000 | Wege et al. |
| 6,218,262 B1 | 4/2001 | Kuroi et al. |
| 6,395,617 B1 * | 5/2002 | Ando ........................ 438/401 |
| 6,420,791 B1 * | 7/2002 | Huang et al. ............... 257/797 |
| 6,447,634 B1 | 9/2002 | Zahorik et al. |
| 6,537,713 B1 * | 3/2003 | Yeo ............................ 430/22 |
| 6,555,925 B1 | 4/2003 | Higashi et al. |
| 6,635,567 B1 | 10/2003 | Ebertseder et al. |
| 6,667,212 B1 * | 12/2003 | Shiraiwa et al. ........... 438/261 |
| 2002/0020890 A1 | 2/2002 | Willer |
| 2002/0098707 A1 | 7/2002 | Ning |
| 2002/0132430 A1 | 9/2002 | Willer et al. |
| 2003/0017707 A1 | 1/2003 | Yamashita et al. |
| 2003/0119274 A1 | 6/2003 | Weis |
| 2004/0092080 A1 * | 5/2004 | Chen .......................... 438/401 |
| 2005/0156335 A1 * | 7/2005 | Chen .......................... 257/797 |

* cited by examiner

*Primary Examiner*—Evan Pert
(74) *Attorney, Agent, or Firm*—Slater & Matsil, L.L.P.

(57) ABSTRACT

A method for manufacturing a semiconductor device includes forming a storage layer over a semiconductor body. The storage layer includes a first boundary layer, an intermediate storage layer and a second boundary layer. The storage layer is patterned so that at least some of the storage layer is removed from over a first portion of the semiconductor body and some of the storage layer is removed from over a second portion of the semiconductor body. The first portion of the semiconductor body is doped and the second portion of the semiconductor body is etched.

20 Claims, 4 Drawing Sheets

METHOD FOR FABRICATING SEMICONDUCTOR MEMORIES WITH CHARGE TRAPPING MEMORY CELLS

TECHNICAL FIELD

The present invention relates generally to semiconductor devices, and more particularly, the preferred embodiment relates to a method for fabricating semiconductor memories with charge trapping memory cells.

BACKGROUND

In the fabrication of electronic components, a plurality of component planes are fabricated in successive process steps. On account of the further miniaturization of these components, the problem arises that the technical means used in this case, in particular the masks, have to be oriented relative to the respective intermediate product of the component in such a way that the various planes are arranged in the envisaged manner with respect to one another.

This requirement demands a very exact alignment of the masks not only relative to the component as a whole but specifically relative to the respectively preceding arrangement of the masks, which is critical for the relative positions of the component structures. A corresponding orientation of the component planes in successive steps of the fabrication process is made more difficult due to the fact that the structures fabricated often do not produce a sufficient optical contrast and so cannot be identified accurately enough in subsequent method steps. That makes it considerably more difficult in particular to align the masks used in later fabrication steps.

SUMMARY OF THE INVENTION

The preferred embodiment of the present invention relates to a method for fabricating semiconductor memories with charge trapping memory cells in which buried bit lines are provided with bit line contacts. In various aspects, this invention solves alignment problems in the fabrication of semiconductor memories with charge trapping memory cells, in particular of NROM memory cells.

Semiconductor memories of this type have buried bit lines fabricated by doping strip-type regions of a semiconductor body. Oxide-nitride-oxide storage layer sequences are provided for the programming of the memory cells. Hot electrons from the channel are trapped in the middle layer, i.e., in the nitride layer, thereby altering the threshold voltage of the transistor cell. In order to erase the cell, the electrons are removed from the storage layer. The storage layer sequence is provided as gate dielectric between a respective channel region in the semiconductor body and a gate electrode arranged thereabove. The gate electrodes are connected to one another by strip-type word lines provided on the top side.

Bit line contacts are fabricated at regular intervals between the word lines, so that it is possible to reduce the electrical bulk resistances of the buried bit lines by conductive connections on the top side. In this case, the problem described above arises such that, in the case of the positions of the bit lines and the bit line contacts being aligned with the active regions in the manner that has been customary hitherto, manufacturing fluctuations occur which are no longer tolerable in the context of increasing miniaturization of the memory cells, since the position of the bit line contacts can no longer be set sufficiently accurately with respect to the buried bit lines.

In one aspect, the present invention specifies an improved method for aligning the bit line contacts with buried bit lines. For example, a method for manufacturing a semiconductor device includes forming a storage layer over a semiconductor body. The storage layer includes a first boundary layer (e.g., oxide), an intermediate storage layer (e.g., nitride), and a second boundary layer (e.g., oxide). The storage layer is patterned so that at least some of the storage layer is removed from over a first portion of the semiconductor body and some of the storage layer is removed from over a second portion of the semiconductor body. The first portion of the semiconductor body is doped and the second portion of the semiconductor body is etched.

By means of the method, alignment marks (alignment structures) are produced together with the bit lines as depressions in the semiconductor body or substrate. These alignment marks enable the fabrication plane of the bit line contacts to be exactly aligned directly with the position of the bit lines. The alignment marks are defined using the same mask with which the position of the buried bit lines is also defined. In this case, a particularly preferred exemplary embodiment provides for the application of an auxiliary layer, preferably made of polysilicon, nitride, nitride+oxide or other materials suitable for hard masks, which is used as a mask for etching the alignment marks. A hard mask is not absolutely necessary, however, as is shown from the explanations below.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a semiconductor memory device that stores charge in a storage layer sequence. Aspects of the invention may also be applied, however, to other semiconductor devices that can utilize alignment markings.

The preferred embodiment will now be described with respect to FIGS. 1–5. For exact alignment of the fabrication plane of the bit line contacts in memories with an ONO storage layer sequence (2, 3, 4), alignment marks (12) are produced together with the bit lines (9) as depressions in the semiconductor body (1) using the same mask. As will be described with respect to FIGS. 6–10, a particularly preferred exemplary embodiment provides for the application of an auxiliary layer, preferably made of polysilicon, which is used as a mask for etching the alignment marks.

Figure 1:
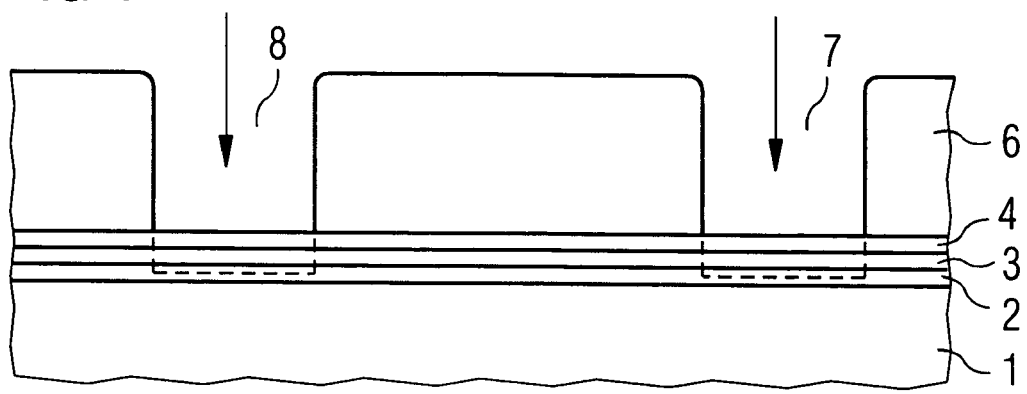
FIG. 1 shows the structure of the mask used, in cross section.

FIG. 1 illustrates, in cross section, a detail from a semiconductor body 1, e.g., a substrate or semiconductor layer formed on a substrate, on the top side of which a storage layer sequence is grown. The storage layer sequence includes a first boundary layer 2, a storage layer 3 and a second boundary layer 4. The storage layer sequence is provided in particular for the formation of charge trapping memory cells and may be an oxide-nitride-oxide layer sequence.

A resist mask 6 is applied to the second boundary layer 4 and patterned. The mask 6 has openings 7 in the region of the buried bit lines to be fabricated. At least one further opening 8 is present at those locations at which a respective alignment mark is provided. As is indicated by the arrows depicted, the storage layer sequence is removed in the openings 7, 8 at least down to the first boundary layer 2.

Figure 2:
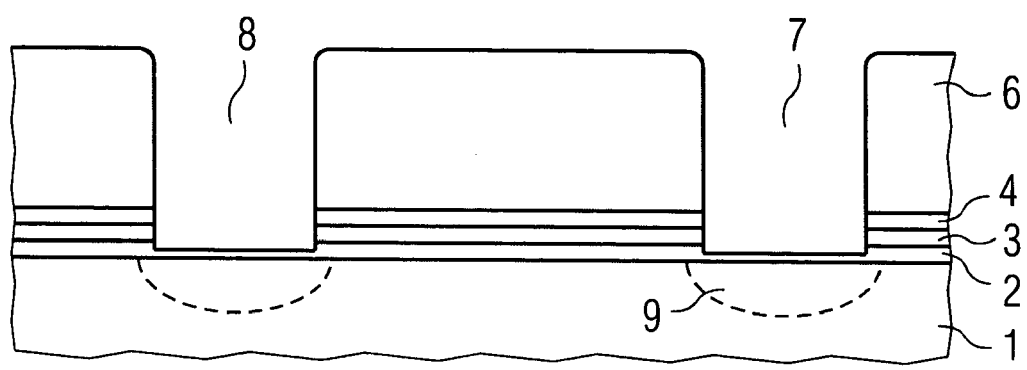
FIG. 2 shows the intermediate product fabricated using the mask, in cross section.

FIG. 2 illustrates the structure after the removal of the storage layer 3 in the openings 7 and 8. Dopant for forming the buried bit lines 9 is then introduced, which is illustrated by the dashed contour of the buried bit line in FIG. 2. In this case, it is optional whether the dopant is also introduced in the region of the further openings, as depicted in FIG. 2, or whether an additional covering of the further openings is used to prevent dopant from penetrating at these locations.

Figure 3:
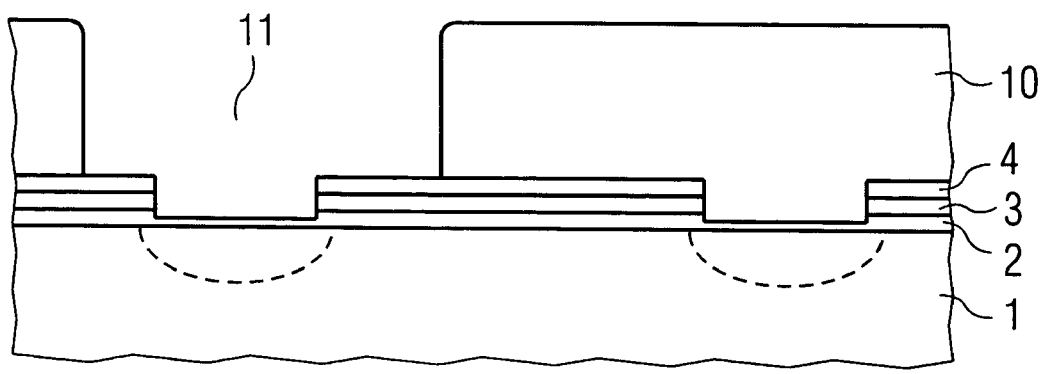
FIG. 3 shows the configuration of a further mask, in cross section.

FIG. 3 illustrates in cross section that after the formation of the buried bit lines 9, the mask 6 is removed and replaced by a further mask 10, preferably a resist mask. The further mask 10 covers the buried bit lines 9 and has openings 11 in the region of the alignment marks to be fabricated. FIG. 3 reveals that this opening 11 of the further mask 10 does not have to correspond precisely to the further opening 8 of the preceding mask 6. It suffices if a sufficiently large region is left free, since the region provided for the alignment mark is defined sufficiently precisely by the preceding etching of the storage layer 3.

Figure 4:
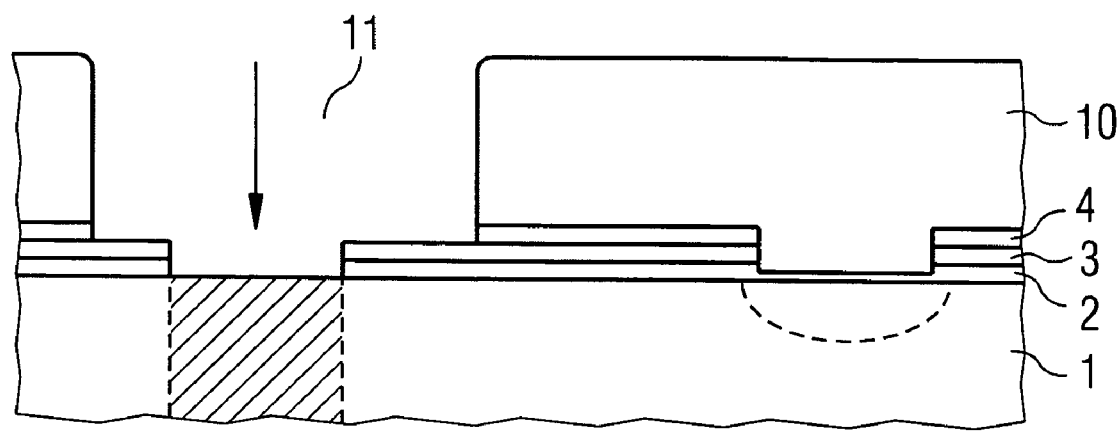
FIG. 4 shows a subsequent etching process, in cross section.

As shown in FIG. 4, using the further mask 10, an etching attack is then effected in the openings 11 of the mask and first of all completely removes the material of the first boundary layer 2 on the top side of the semiconductor body 1. If the material of the second boundary layer 4 corresponds to the material of the first boundary layer 2, and in particular is an oxide, the material of the second boundary layer 4 is likewise completely removed in the region of the opening 11, as is illustrated in FIG. 4. Since the storage layer sequence is not intended to fulfill the storage function in the region of the alignment mark to be fabricated, this removal has no adverse consequences. The material of the semiconductor body 1 or substrate is then etched out in the region depicted in hatched fashion in the direction of the arrow depicted in FIG. 4.

Figure 5:
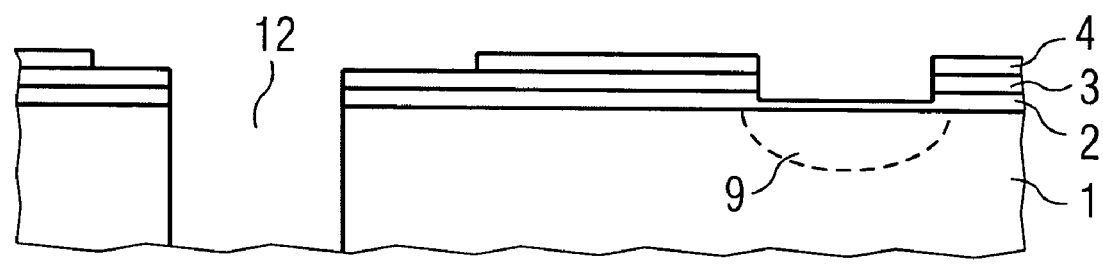
FIG. 5 shows the structure of an alignment mark, in cross section.

FIG. 5 shows the structure thus achieved, in cross section, after the further mask 10 has been removed. This structure now includes an alignment mark 12 that can be used to ensure alignment of later masks. This intermediate product can then be processed further in a semiconductor memory fabrication process known per se.

Figure 6:
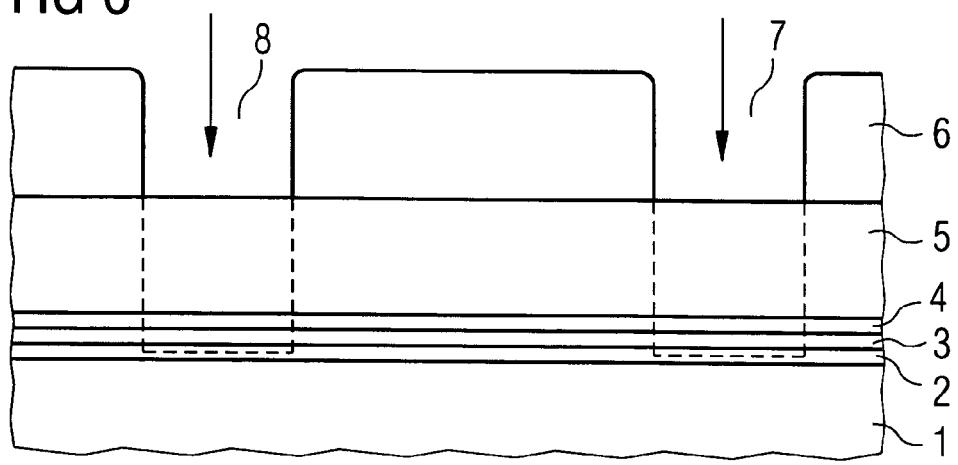
FIG. 6 shows the auxiliary layer and the structure of the mask, in cross section.

In a particularly preferred further exemplary embodiment of the method, an auxiliary layer is additionally applied. FIG. 6 illustrates the structure—corresponding to FIG. 1—for this further exemplary embodiment, in cross section. The storage layer sequence is applied over the whole area on the semiconductor body 1 or substrate. An auxiliary layer 5 is applied thereon, which auxiliary layer is preferably polysilicon, nitride, nitride and oxide or some other material suitable for hard masks and has a typical thickness of about 100 nm. The mask 6 is applied thereon and patterned in the manner already described, so that is has openings 7 in the region of the buried bit lines to be fabricated and at least one further opening 8 in the region of each alignment mark to be fabricated.

Figure 7:
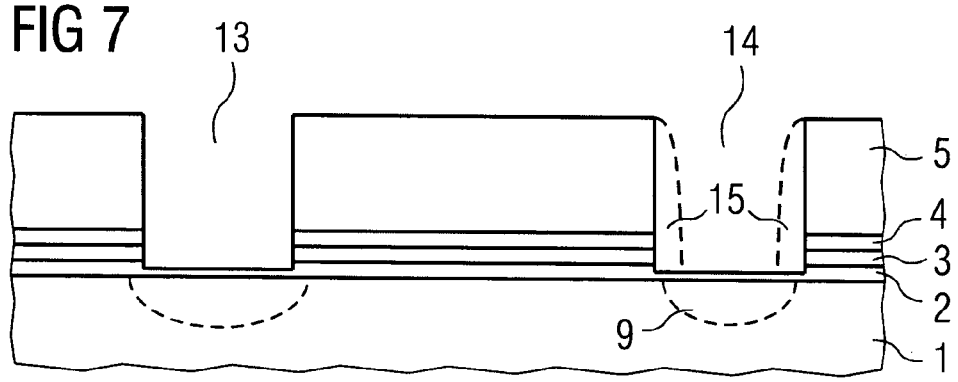
FIG. 7 shows an intermediate product fabricated using the mask, in cross section.

After the material of the auxiliary layer 5 and the material of the storage layer sequence have been etched out down to the first boundary layer 2 in the region of the openings of the mask 6, the dopant for forming the buried bit lines 9 may again be introduced, in accordance with the cross section of FIG. 7. If necessary, in the opening 14 of the auxiliary layer 5 in the region of the bit lines to be fabricated, spacer elements, i.e., the spacers 15, which are depicted by dashed lines in FIG. 7, may be fabricated at the sidewalls of the auxiliary layer 5. That is done in the manner known per se by conformal whole-area deposition of the material provided for the spacers and subsequent anisotropic etching-back. The spacers 15 additionally reduce the dimension of the opening 14, so that the doped regions provided for the buried bit lines may be offset to a somewhat greater extent than the remaining portions of the storage layer sequence. A further mask 16, preferably a resist mask, is then applied, which leaves free the regions provided for the alignment marks, i.e., the openings 13 in the auxiliary layer 5.

Figure 8:
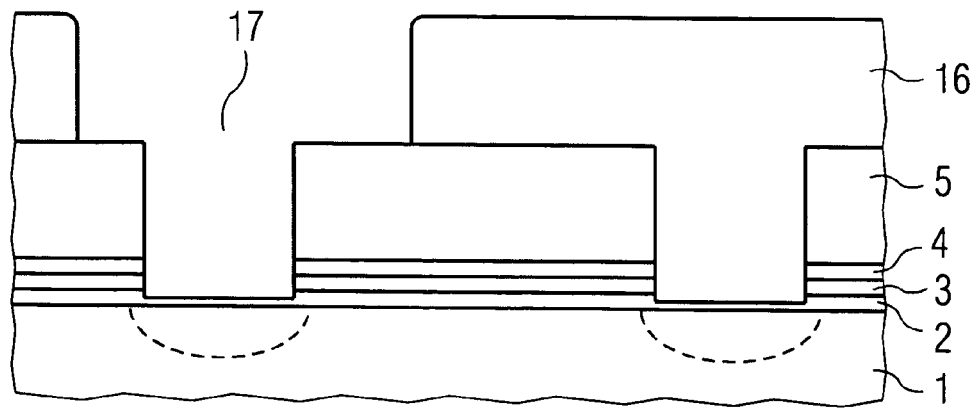
FIG. 8 shows the structure of the auxiliary layer and of a further mask, in cross section.

FIG. 8 illustrates this further mask 16, in cross section. It can be seen here that the openings 17 of the further mask 16, as in the preceding exemplary embodiment, do not have to have the same dimensions as the openings 13 of the auxiliary layer 5. The openings 17 in the further mask 16 may have larger dimensions; it is only necessary to leave free the region of the alignment mark to be fabricated. The opening 17 is preferably, but not necessarily, the same size or larger than the opening 13. Material of the first boundary layer 2 still present is possibly removed first of all using said further mask 16.

Figure 9:
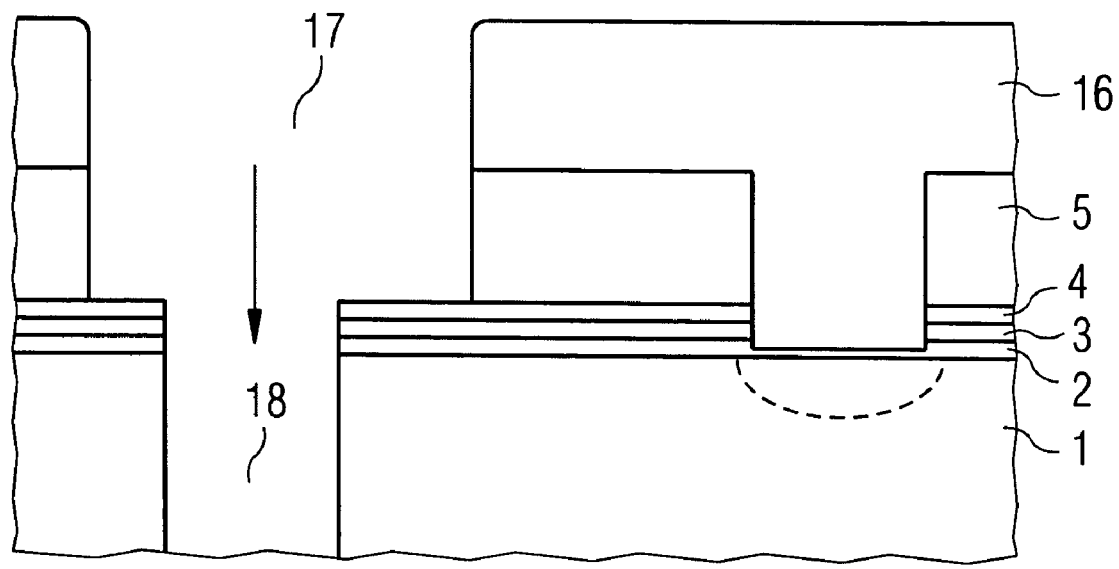
FIG. 9 shows the etching process of the alignment marks in cross section.

A cutout 18 may then be etched into the semiconductor material in the direction of the arrow in accordance with the illustration of FIG. 9. If the auxiliary layer 5 is polysilicon, the polysilicon of the auxiliary layer 5 is likewise removed in the region of the opening 17 during the etching process.

Figure 10:
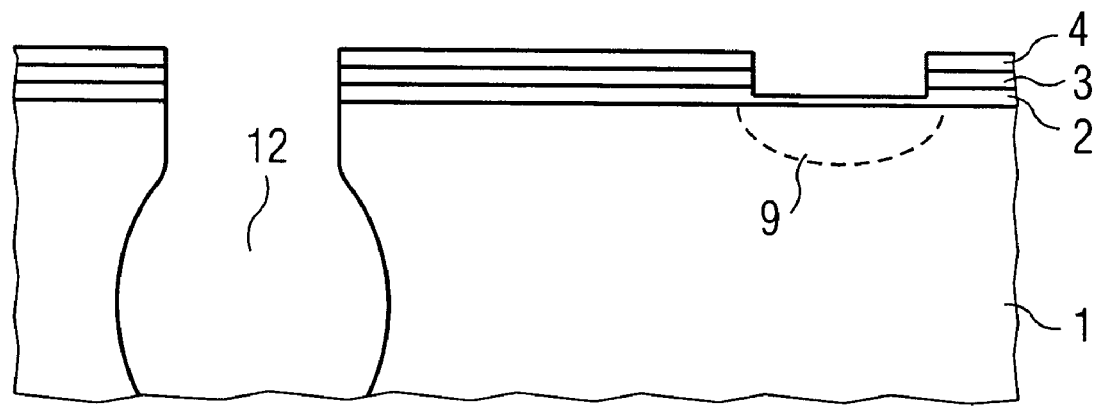
FIG. 10 shows the structure of a finished alignment mark.

FIG. 10 shows the structure achieved, in cross section, after the further mask 16 and the auxiliary layer 5 have been removed. The opening 12 provided for the alignment mark in the semiconductor material may be slightly laterally expanded (etched bottle effect) if the material of the auxiliary layer 5 was polysilicon and the material of the semiconductor body or substrate is silicon and is therefore removed again during the removal of the auxiliary layer. That does not impair the function of the alignment mark since the alignment mark has sufficiently small dimensions.

In the case of an oxide-nitride-oxide storage layer sequence, the etching processes may be performed by dry etching or wet etching using DHF or phosphoric acid, while the semiconductor material, in particular silicon, is removed by anisotropic RIE etching (reactive ion etching). The auxiliary layer is removed e.g., wet-chemically selectively with respect to the oxide of the second boundary layer 3, e.g., using $NH_4OH$.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for manufacturing a semiconductor device, the method comprising:
    forming a storage layer over a semiconductor body, the storage layer including a first boundary layer, an intermediate storage layer and a second boundary layer;
    patterning the storage layer so that at least some of the storage layer is removed from over a first portion of the semiconductor body and some of the storage layer is removed from over a second portion of the semiconductor body;
    doping the first portion of the semiconductor body; and
    etching the second portion of the semiconductor body without etching the first portion of the semiconductor body.

2. The method of claim 1 wherein the first boundary layer comprises an oxide layer, wherein the storage layer comprises a nitride layer, and wherein the second boundary layer comprises an oxide layer.

3. The method of claim 1 wherein patterning the storage layer comprises:
    forming a mask over the storage layer;
    forming openings in the mask over the first portion of the semiconductor body and over the second portion of the semiconductor body; and
    etching portions of the storage layer that are exposed by the openings.

4. The method of claim 3 wherein etching the second portion of the semiconductor body comprises:
    forming a second mask over the storage layer; and
    forming an opening in the second mask over the second portion of the semiconductor body.

5. The method of claim 4 wherein the opening in the second mask is larger than the opening in the mask over the second portion, and wherein the etching is performed using the storage layer as an etch mask.

6. The method of claim 3 wherein doping the first portion of the semiconductor body comprises implanting ions through the openings in the mask.

7. The method of claim 1 and further comprising doping the second portion of the semiconductor body at the same time the first portion is doped.

8. The method of claim 1 and further comprising forming an auxiliary layer over the storage layer prior to patterning the storage layer.

9. The method of claim 8 wherein the auxiliary layer comprises at least one material selected from the group consisting of polysilicon, nitride, and oxide.

10. The method of claim 1 wherein the semiconductor body comprises a semiconductor substrate.

11. A method for fabricating semiconductor memories with charge trapping memory cells, the method comprising:
    in a first step, applying a storage layer sequence made of dielectric material to a semiconductor body, the layer sequence comprising a first boundary layer, a storage layer and a second boundary layer;
    in a second step, forming buried bit lines in the semiconductor body by introducing dopants through a mask with openings; and
    in a third step, completing formation of a memory device, wherein:
    in the second step, the mask is provided with at least one further opening for the definition of an alignment mark and the material of the storage layer is removed in the region of the openings and of each further opening; and
    in a further step between the second and third steps, using a further mask, a cutout is etched out into the semiconductor body in the region of an alignment mark to be fabricated.

12. The method of claim 11 and further comprising:
    in a second further step between the first and second steps, applying an auxiliary layer to the second boundary layer;
    wherein:
    in the second step, the auxiliary layer is removed in the region of the openings and of each further opening; and
    after the further step, the auxiliary layer is removed.

13. The method of claim 12 wherein the auxiliary layer comprises a polysilicon layer.

14. The method of claim 11 wherein the semiconductor body comprises a semiconductor substrate.

15. A method for forming an alignment mark while fabricating a semiconductor memory with charge trapping memory cells, the method comprising:
    providing a silicon body;
    forming a storage layer over the semiconductor body by forming a first oxide layer followed by forming a nitride layer followed by forming a second oxide layer;
    forming a first masking layer over the storage layer;
    forming a first opening in the masking layer over a first portion of the silicon body and a second opening in the masking layer of a second portion of the silicon body;
    removing portions of the second oxide layer and the nitride layer exposed by the first opening and the second opening;
    forming a buried bitline by doping the first portion of the silicon body;
    removing the first masking layer;
    forming a second masking layer over the storage layer;
    forming an opening in the second masking layer over the second portion of the masking layer; and
    etching the second portion of the silicon body.

16. The method of claim 15 wherein forming an opening in the second masking layer comprises forming an opening that is larger than the second opening, wherein the second portion of the silicon body is etched using the storage layer as an etch mask.

17. The method of claim 16 and further comprising removing a portion of the first oxide layer exposed by the opening in the second masking prior to etching the second portion of the silicon body.

18. The method of claim 17 wherein removing a portion of the first oxide layer further includes removing a portion of the second oxide layer, and wherein the second portion of the silicon body is etched using the nitride layer as an etch mask.

19. The method of claim 15 and further comprising forming an auxiliary layer over the storage layer prior to forming the first masking layer.

20. The method of claim 19 wherein the auxiliary layer comprises a polysilicon layer.

* * * * *